(12) United States Patent
Schneider et al.

(10) Patent No.: US 7,738,160 B2
(45) Date of Patent: Jun. 15, 2010

(54) OPTICAL COMPONENTS, ILLUMINATION SYSTEMS, AND METHODS

(75) Inventors: Jens Schneider, Moritzburg (DE); Vlad Temchenko, Dresden (DE)

(73) Assignee: Infineon Technologies AG, Munich (DE)

( * ) Notice: Subject to any disclaimer, the term of this patent is extended or adjusted under 35 U.S.C. 154(b) by 260 days.

(21) Appl. No.: 11/803,307

(22) Filed: May 14, 2007

(65) Prior Publication Data

US 2008/0285001 A1    Nov. 20, 2008

(51) Int. Cl.
G02F 1/00 (2006.01)
G02F 1/29 (2006.01)
H01L 21/00 (2006.01)

(52) U.S. Cl. .......................... 359/322; 359/315; 438/29

(58) Field of Classification Search ......... 359/315–320, 359/642, 665, 666, 322; 438/29
See application file for complete search history.

(56) References Cited

U.S. PATENT DOCUMENTS

| | | | | | |
|---|---|---|---|---|---|
| 3,245,315 | A | * | 4/1966 | Marks et al. | 359/254 |
| 4,636,786 | A | * | 1/1987 | Haertling | 345/84 |
| 4,838,657 | A | * | 6/1989 | Miura et al. | 349/111 |
| 6,184,969 | B1 | * | 2/2001 | Fergason | 349/196 |
| 6,992,731 | B1 | * | 1/2006 | Morris | 349/13 |
| 2006/0066939 | A1 | * | 3/2006 | Kimura | 359/321 |
| 2008/0247743 | A1 | * | 10/2008 | Liang et al. | 396/175 |

FOREIGN PATENT DOCUMENTS

JP     05142979 A  *  6/1993

OTHER PUBLICATIONS

De Boeij, W., et al., "Enabling the 45nm Node by Hyper-NA Polarized Lithography," Optical Microlithography XIX, Proc. of SPIE, 2006, pp. 61540B-1-61540B-11, vol. 6154, SPIE, Bellingham, WA.
Fujiura, K., et al., "KTN Optical Waveguide Devices with an Extremely Large Electro-optic Effect," Proc. of SPIE, Jan. 2005, vol. 5623, pp. 518-532, SPIE, Bellingham, WA.
Kerr, J., "XL. A New Relation Between Electricity and Light: Dielectrified Media Birefringent," The London, Edinburgh, and Dublin Philosophical Magazine and Journal of Science, Nov. 1875, pp. 337-348, 446-458, Ser. 4, vol. 50, No. 332.
Kerr, J., "XI. Electro-optic Observations on Various Liquids," The London, Edinburgh, and Dublin Philosophical Magazine and Journal of Science, Aug. 1879, pp. 85-102, Ser. 5, vol. 8, No. 47.
Kye, J., et al., "Polarization Aberration Analysis in Optical Lithography Systems," Optical Microlithography XIX, Proc. of SPIE, 2006, pp. 61540E-1-61540E-11, vol. 6154, SPIE, Bellingham, WA.

(Continued)

*Primary Examiner*—William C Choi
(74) *Attorney, Agent, or Firm*—Slater & Matsil, L.L.P.

(57) ABSTRACT

Lithography aperture lenses, illumination systems, and methods are disclosed. In a preferred embodiment, a lens includes a substantially transparent material and an electro-optical material disposed proximate the substantially transparent material, wherein the lens is a lens for an illuminator of a lithography system.

27 Claims, 7 Drawing Sheets

OTHER PUBLICATIONS

McIntyre, G., et al., "Experimental Verification of PSM Polarimetry: Monitoring Polarization at 193-nm High-NA with Phase-Shift Masks," Optical Microlithography XIX, Proc. of SPIE, 2006, pp. 61540D-1-61540D-12, vol. 6154, SPIE, Bellingham, WA.

Ozawa, K., et al., "Effect of Azimuthally Polarized Illumination Imaging on Device Patterns Beyond the 45-nm-Node," Optical Microlithography XIX, Proc. of SPIE, 2006, pp. 61540C-1-61540C-12, vol. 6154, SPIE, Bellingham, WA.

Park, C., et al., "High NA Polarized Light Lithography for 0.29k1 Process," Optical Microlithography XIX, Proc. of SPIE, 2006, pp. 61540F-1-61540F-12, vol. 6154, SPIE, Bellingham, WA.

"R&D Information: Successful Preparation of KTN Crystals with the Highest Reported Electro-optic Effect and the Potential for Providing a Great Improvement in Optical Device Performance," NTT Technical Review, Dec. 2003, pp. 56-61, vol. 1, No. 9, NTT Cyber Solutions Laboratories, Yokosuka-shi, Japan.

Smith, B., et al., "Evanescent Wave Imaging in Optical Lithography," SPIE 2006: Hyper-NA and Polarization, Mar. 2006, 9 pp., vol. 6154, No. 10, SPIE, Bellingham, WA.

Wolf, S., et al., "Silicon Processing for the VLSI Era: vol. 1: Process Technology," 2nd Ed., 2000, Sec. 13.4: Optical Lithography Exposure Systems, pp. 588-595, Lattice Press, Sunset Beach, CA.

Yin, S., et al., "Giant Electro-Optic Effect of PMN-33%PT Single Crystals Under Proper AC Electric Field Bias," Photorefractive Fiber and Crystal Devices: Materials, Optical Properties, and Applications IX, Proceedings of SPIE, 2003, pp. 280-289, vol. 5206, SPIE, Bellingham, WA.

* cited by examiner

OPTICAL COMPONENTS, ILLUMINATION SYSTEMS, AND METHODS

TECHNICAL FIELD

The present invention relates generally to the fabrication of semiconductor devices, and more particularly to illumination systems used in lithography systems.

BACKGROUND

Generally, semiconductor devices are used in a variety of electronic applications, such as computers, cellular phones, personal computing devices, and many other applications. Home, industrial, and automotive devices that in the past comprised only mechanical components now have electronic parts that require semiconductor devices, for example.

Semiconductor devices are manufactured by depositing many different types of material layers over a semiconductor workpiece, wafer, or substrate, and patterning the various material layers using lithography. The material layers typically comprise thin films of conductive, semiconductive, and insulating materials that are patterned and etched to form integrated circuits (ICs). There may be a plurality of transistors, memory devices, switches, conductive lines, diodes, capacitors, logic circuits, and other electronic components formed on a single die or chip, for example.

For many years in the semiconductor industry, optical lithography techniques such as contact printing, proximity printing, and projection printing have been used to pattern and alter material layers of integrated circuits. Optical photolithography involves projecting or transmitting light to expose a layer of photosensitive material on a semiconductor workpiece through a pattern comprised of optically opaque or translucent areas and optically clear or transparent areas on a lithography mask or reticle. After development, the photosensitive material layer is then used as a mask to pattern or alter an underlying material layer of the semiconductor workpiece.

There is a trend in the semiconductor industry towards scaling down the size of integrated circuits, to meet the demands of increased performance and smaller device size. As features of semiconductor devices become smaller, lithography processes become more difficult.

Thus, what are needed in the art are improved lithography systems and methods for patterning and processing material layers of semiconductor devices.

SUMMARY OF THE INVENTION

These and other problems are generally solved or circumvented, and technical advantages are generally achieved, by preferred embodiments of the present invention, which provide novel aperture lenses for lithography illuminations systems, and methods.

In accordance with a preferred embodiment of the present invention, a lens includes a substantially transparent material and an electro-optical material disposed proximate the substantially transparent material, wherein the lens is a lens for an illuminator of a lithography system.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that embodiments of the present invention provide many applicable inventive concepts that can be embodied in a wide variety of specific contexts. The specific embodiments discussed are merely illustrative of specific ways to make and use the invention, and do not limit the scope of the invention.

As critical dimensions of advanced generation technology nodes decrease, which is the trend in the semiconductor industry, the need to control and obtain suitable process window margins increases. Some approaches of enhancing resolution and increasing process margins of lithography processes include the use of optical proximity correction, phase shifting masks, immersion lithography, and polarized illumination, as examples. Immersion lithography increases the depth of focus, and polarized illumination increases exposure latitude of lithography systems, for example.

Special shaped illumination apertures are needed when polarized illumination is used, in order to provide the desired polarization settings. However, conventional exposure tools comprise illuminators that only have a few number of illumination settings. An illuminator may include a rotatable canister with a fixed number of mechanical apertures that each provide an illumination setting. The mechanical apertures comprise aperture shapes such as circular, annular, quadrapole, dipole, or single pole. A rotatable canister typically comprises about five aperture opening designs, for example. The number of illumination apertures in conventional illuminators is fixed and cannot be freely varied.

Embodiments of the present invention achieve technical advantages by providing highly flexible illumination systems that achieve a large number of arbitrary-shaped illumination apertures. An aperture design in accordance with embodiments of the present invention comprises a lens that includes an arbitrary shaped illumination shutter, providing a highly flexible solution for an illumination aperture. The lens may be adapted to provide not only circular, annular, quadrapole, dipole, or single pole illumination apertures, but combinations thereof and multiple sizes thereof on a single lens.

The novel lenses including arbitrary-shaped illumination apertures of embodiments of the present invention are achieved by the use of electro-optical materials disposed on the aperture. Because an optical transmissiveness of the electro-optical material changes when an electric field is applied, illumination apertures with different shapes and combinations may be switched on or off using voltages applied to the electro-optical material.

Figure 1:
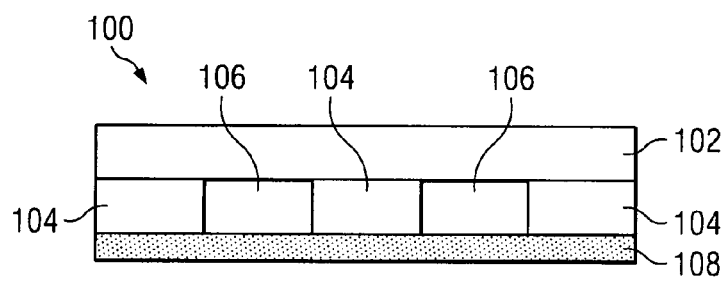
FIG. 1 shows a cross-sectional view of a novel aperture lens for an illuminator of a lithography system comprising a lens that includes an electro-optical material disposed thereon in accordance with an embodiment of the present invention.

FIG. 1 shows a cross-sectional view of a lens 100 in accordance with a preferred embodiment of the present invention. The lens 100 is also referred to herein as an aperture lens. The lens 100 includes a substantially transparent material 102, as shown. The substantially transparent material 102 preferably comprises glass, quartz, other type of optically transmissive material, or other materials, as examples. The substantially transparent material 102 preferably comprises a material that is transparent to deep ultraviolet (DUV), extreme UV (EUV) light, optical light, or other types of energy used in an exposure process, for example. The substantially transparent material 102 of the lens 100 may comprise a thickness of about 6 mm or less, as an example, although the substantially transparent material 102 may comprise other dimensions.

The lens 100 includes an electro-optical material 108 disposed proximate the substantially transparent material 102. The lens 100 may include an optional opaque material 104 comprising at least one pattern 106, as shown. The opaque material 104 may be disposed between the substantially transparent material 102 and the electro-optical material 108, as shown in FIG. 1, or the opaque material 104 may be disposed on one side of the substantially transparent material 102 and the electro-optical material 108 may be disposed on the other side of the substantially transparent material 102 opposite the side the opaque material 104 is disposed on (not shown in FIG. 1). The opaque material 104 preferably comprises an optically opaque material such as chromium (Cr), although alternatively, other opaque materials may also be used. The opaque material 104 preferably comprises a thickness of about 50 μm or less, as an example, although alternatively, the opaque material 104 may comprise other dimensions. The opaque material 104 is preferably disposed adjacent to at least the substantially transparent material 102 (and optionally also adjacent to the electro-optical material 108 as shown in FIG. 1). The opaque material 104 preferably comprises at least one pattern 106 disposed thereon, as shown.

The electro-optical material 108 preferably comprises a birefringent material. The electro-optical material 108 preferably comprises a material that changes the amount of light or energy transmitted through it depending on the amount of electric field applied to (e.g., across) the electro-optical material 108. For example, in some embodiments, an index of refraction and/or an amount of absorption of at least a portion of the electro-optical material 108 is preferably alterable by applying an electric field to the electro-optical material 108. The electro-optical material 108 preferably comprises an optically active material that exhibits electro-gyration or a quadratic electro-optic effect, e.g., a Kerr Effect, wherein the change in the refractive index is proportional to the square of the electric field, as examples.

The electro-optical material 108 preferably comprises LBO ($LiB_3O_5$), BBO (beta-$BaB_2O_4$), CLBO ($CsLiB_6O_{10}$), and/or KDP ($KH_2PO_4$), or other transparent optical crystal materials, as examples, although alternatively, the electro-optical material 108 may comprise other materials. The electro-optical material 108 is preferably grown or deposited, e.g., using direct current (DC) and/or radio frequency (RF) magnetron sputtering, thermal evaporation, physical vapor deposition (PVD), liquid phase epitaxy (LPE), or chemical vapor deposition (CVD), although other methods may also be used to form the electro-optical material 108. The electro-optical material 108 preferably comprises a thickness of about 6 mm or less, for example, although alternatively, the electro-optical material 108 may comprise other dimensions. The electro-optical material 108 preferably comprises a thickness of about 100 μm to 6 mm in some embodiments, for example.

The electro-optical material 108 preferably comprises a material of which portions may be switched or altered from being substantially transparent and substantially or partially opaque, e.g., to light or energy, by applying various voltages to the electro-optical material 108 at various locations and creating an electric field across the electro-optical material 108. As an example, at least a portion of the electro-optical material 108 may be made optically substantially transparent by applying a first voltage to the at least a portion of the electro-optical material 108. At least a portion of the electro-optical material 108 may be made optically substantially or partially opaque by applying a second voltage to the at least a portion of the electro-optical material, the second voltage being different than the first voltage, the second voltage being applied in the same location as the first voltage was applied.

In embodiments wherein the optional patterned opaque material 104 is not included, for example, one or more voltages may be applied across portions of the electro-optical material 108 to form arbitrary shaped illumination apertures on the lens 100. In other embodiments wherein the patterned opaque material 104 is included in the lens 100, one or more voltages may be applied across portions of the electro-optical material 108 to block or expose regions or portions of the patterned opaque material 104, to be described further herein.

Figure 2:
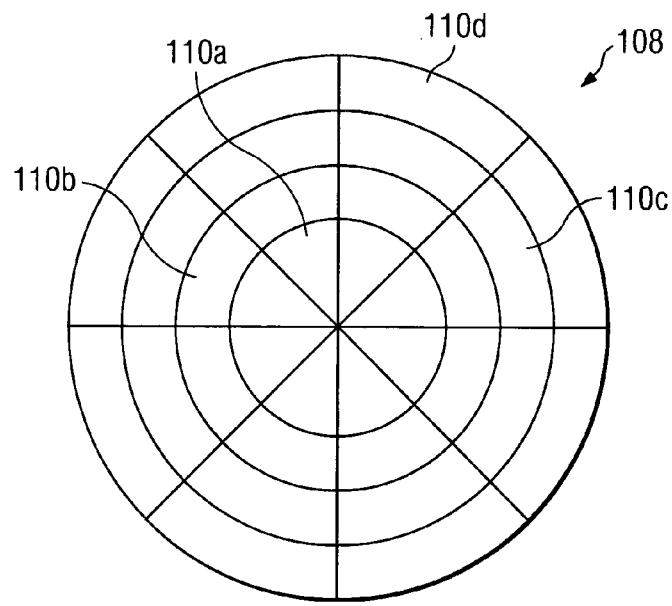
FIG. 2 shows a top or bottom view of the electro-optical material of the lens of FIG. 1 in accordance with a first embodiment of the present invention, wherein the electro-optical material comprises a plurality of alterable segments.

FIG. 2 shows a top or bottom view of the electro-optical material 108 of the lens 100 of FIG. 1 in accordance with a first embodiment of the present invention, wherein the electro-optical material 108 comprises a plurality of alterable segments 110a, 110b, 110c, and 110d. The arrangement of the segments 110a, 110b, 110c, and 110d shown in FIG. 2 is exemplary; alternatively, the segments 110a, 110b, 110c, and 110d of the electro-optical material 108 may be arranged in other shapes, e.g., in a grid-like array. In the example shown, the electro-optical material 108 includes segments 110a in a central region, with each segment 110a comprising a wedged shape. Segments 110b are disposed adjacent each wedged segment 110a in an arc-like pattern. Segments 110c and 110d extend radially concentrically away from segments 110b and the wedged segments 110a.

The electro-optical material 108 shown in FIG. 2 may be used on a lens 100 that includes a patterned opaque material 104. Portions of the electro-optical material 108 may be exposed to an electric field by applying one or more voltages across the electro-optical material 108 to expose or block portions of the patterns 106 of the opaque material 104 using the electro-optical material 108 in this embodiment.

Alternatively, the electro-optical material 108 shown in FIG. 2 may be used on a lens 100 that does not include the optional opaque material 104. In this embodiment, the electro-optical material 108 provides a variety of illumination aperture shapes, by applying various voltages simultaneously to one or more of the segments 110a, 110b, 110c, and 110d. For example, all segments 110d may be made transparent while all other segments 110a, 110b, and 110c are made opaque, forming an annular illumination setting. As another example, every other segment 110c may be made transparent while the other segments 110a, 110b, 110c and 110d are made opaque, forming a quadrapole illumination setting. As yet another example, all wedged segments 110a may be made transparent while the other segments 110b, 110c, and 110d are made opaque, forming a single pole illumination setting (e.g., a single beam of energy or light would then be passed through the lens 100). Combinations of these shapes may also be obtained by applying voltages in (e.g., across) the desired segment 110a, 110b, 110c, and 110d regions to activate or de-activate the segments 110a, 110b, 110c, and 110d during an exposure process, for example. Each segment 110a, 110b, 110c, and 110d can advantageously be switched individually to form many different illumination aperture shapes: annular, circular, single pole, multipole, and combinations thereof. The voltages may be applied across the segments 110a, 110b, 110c, and 110d, wherein wires used to provide the voltages preferably comprise sub-resolution sizes so that they are not resolved on a semiconductor device during an exposure process, for example.

The novel use of the electro-optical material 108 on the aperture lens 100 provides a means of creating a variety of different illumination aperture shapes using the electrical properties of the electro-optical material 108; e.g., the electric field is changed to alter the optical transmissivity of portions of the electro-optical material 108. For example, an index of refraction and/or an amount of absorption of at least a portion of the electro-optical material 108 may be altered by applying an electric field to the electro-optical material 108. In embodiments wherein the patterned opaque material 104 is included, altering the index of refraction and/or the amount of absorption of at least a portion of the electro-optical material 108 results in blocking, exposing, or dimming at least a portion of at least one pattern 106 formed in the substantially opaque material 104.

As an example, a change in the refractive index of the electro-optical material 108, δn, may be defined by Equation 1, $$\delta n \sim K*E \qquad \text{Eq. 1:}$$

wherein n is an optical constant of the electro-optical material 108 under normal conditions, K is a linear electro-optic (EO) constant, and E is the electrical field.

In embodiments wherein the opaque material 104 is included, the opaque material 104 preferably comprises one or more patterns 106, and portions of the patterns may be blocked or dimmed to form other pattern shapes. The patterns 106 comprise predefined structures of which portions may be completely or partially blocked using the electro-optical material 108. FIGS. 3A through 3C, 4A through 4C, and 5A and 5B show some examples of shapes of patterns that may be formed in the opaque material 104. The pattern shapes illustrated in FIGS. 3A through 3C, 4A through 4C, and 5A and 5B are exemplary; alternatively, other patterns 106 may be formed in the opaque material 104.

Figure 3A:
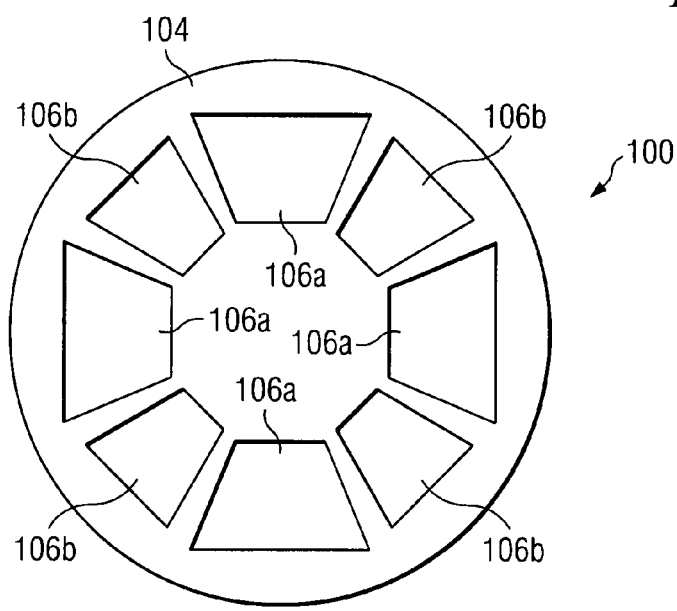
FIG. 3A shows a top view or bottom view of a patterned opaque material of the lens of FIG. 1 in accordance with a second embodiment of the present invention, wherein the pattern of the opaque material comprises two quadrapole aperture patterns.
Figure 3B:
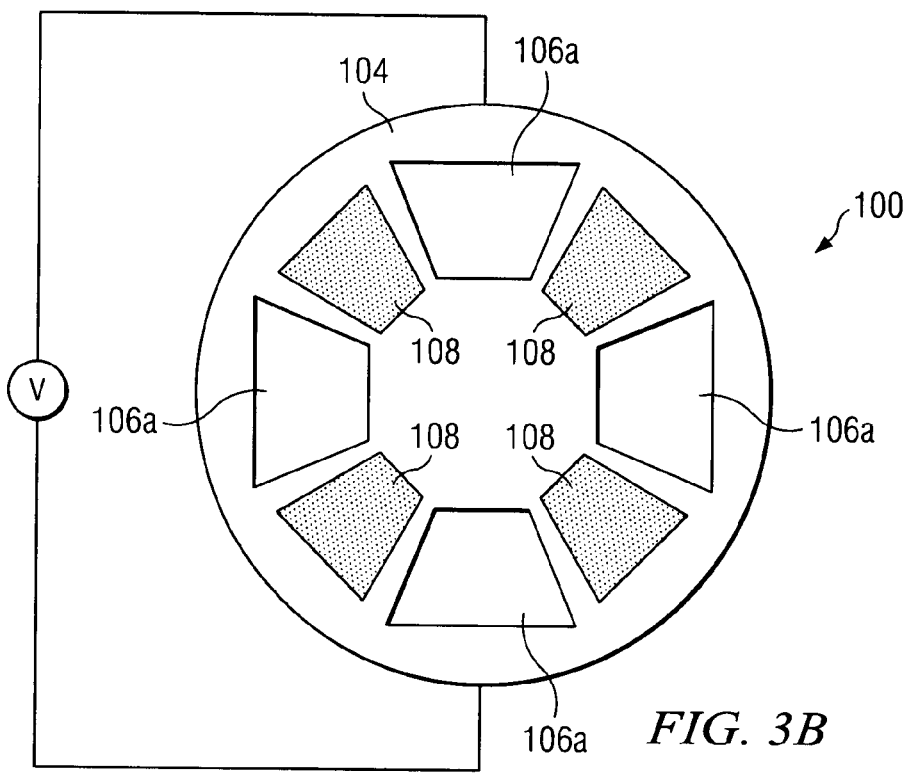
FIG. 3B shows the lens of FIG. 3A after a first voltage is applied to the electro-optical material, resulting in a first portion of the patterned opaque material of the lens being blocked.
Figure 3C:
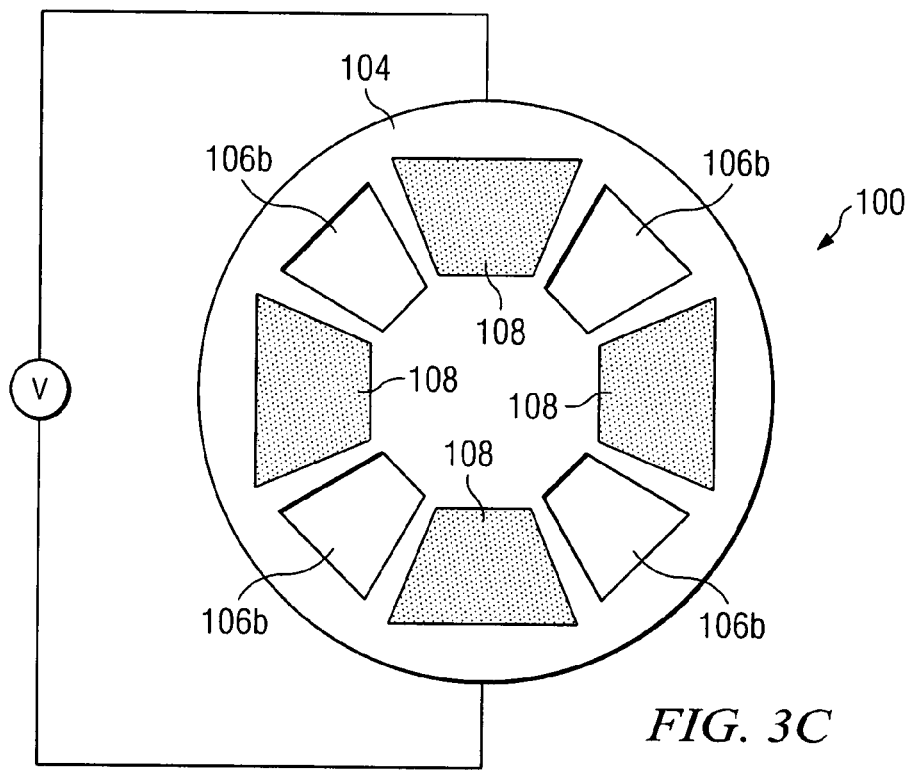
FIG. 3C shows the lens of FIG. 3A after a second voltage is applied to the electro-optical material, resulting in a second portion of the patterned opaque material of the lens being blocked.

Referring next to FIG. 3A, a top view or bottom view of the patterned opaque material 104 of the lens 100 of FIG. 1 in accordance with a second embodiment of the present invention is shown, wherein the pattern 106 of the opaque material 104 comprises two quadrapole patterns 106a and 106b. FIG. 3B shows the lens 100 of FIG. 3A after a first voltage supplied by a voltage source V is applied to the electro-optical material 108, resulting in a first portion, e.g., pattern 106b, of the patterned opaque material 104 of the lens 100 being blocked with the electro-optical material 108 and leaving the pattern 106a exposed. FIG. 3C shows the lens 100 of FIG. 3A after a second voltage supplied by voltage source V, is applied to the electro-optical material 108, resulting in a second portion, e.g., pattern 106a, of the patterned opaque material 104 of the lens 100 being blocked by the electro-optical material 108 and leaving the pattern 106b exposed. Note that in this embodiment, the second voltage is applied in a different location on the electro-optical material 108 than the first voltage is applied, to achieve a different region of the electro-optical material 108 being blocked. The second voltage may comprise the same or different voltage level as the first voltage, for example.

The pattern 106b of the patterned opaque material 104 shown in FIG. 3C comprises a quadrapole pattern wherein each aperture is smaller than the apertures of the pattern 106a of the patterned opaque material 104 shown in FIG. 3B. Thus, either a large aperture or small aperture quadrapole pattern may be selected in the embodiment shown in FIGS. 3A, 3B, and 3C. Note that only two quadrapole patterns 106a and 106b are shown in this embodiment; alternatively, additional quadrapole patterns or other shaped patterns may be included in the opaque material 104 and may be selected or deselected using the novel electro-optical material 108 of the lens 100, not shown.

Thus, using the voltage source V, an electrical field is applied to the electro-optical material 108, wherein the electro-optical material 108 is adapted to fully block, partially block, or expose a portion of the pattern within the layer of opaque material 104.

Figure 4A:
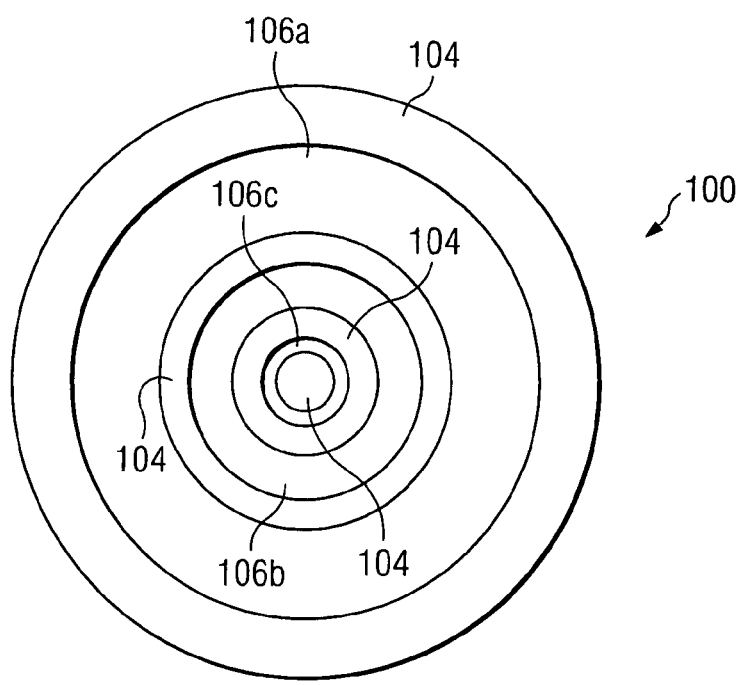
FIG. 4A shows a top view or bottom view of the patterned opaque material of the lens of FIG. 1 in accordance with a third embodiment of the present invention, wherein the pattern of the opaque material comprises a plurality of annular aperture patterns.
Figure 4B:
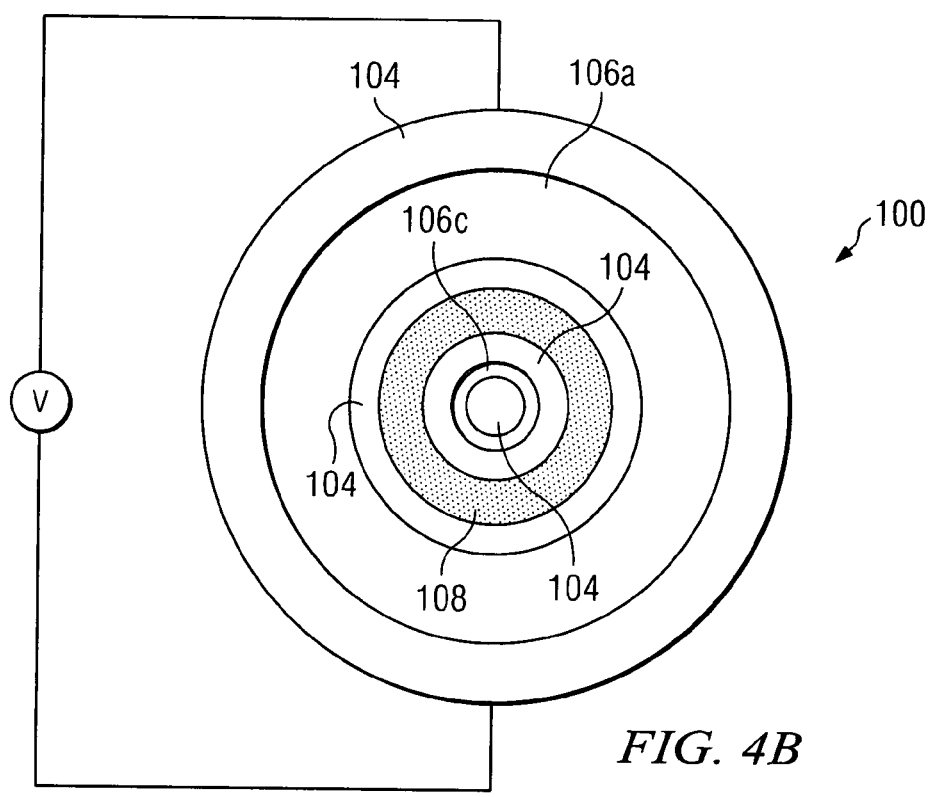
FIG. 4B shows the lens of FIG. 4A after a first voltage is applied to the electro-optical material, resulting in a first portion of the patterned opaque material of the lens being blocked.
Figure 4C:
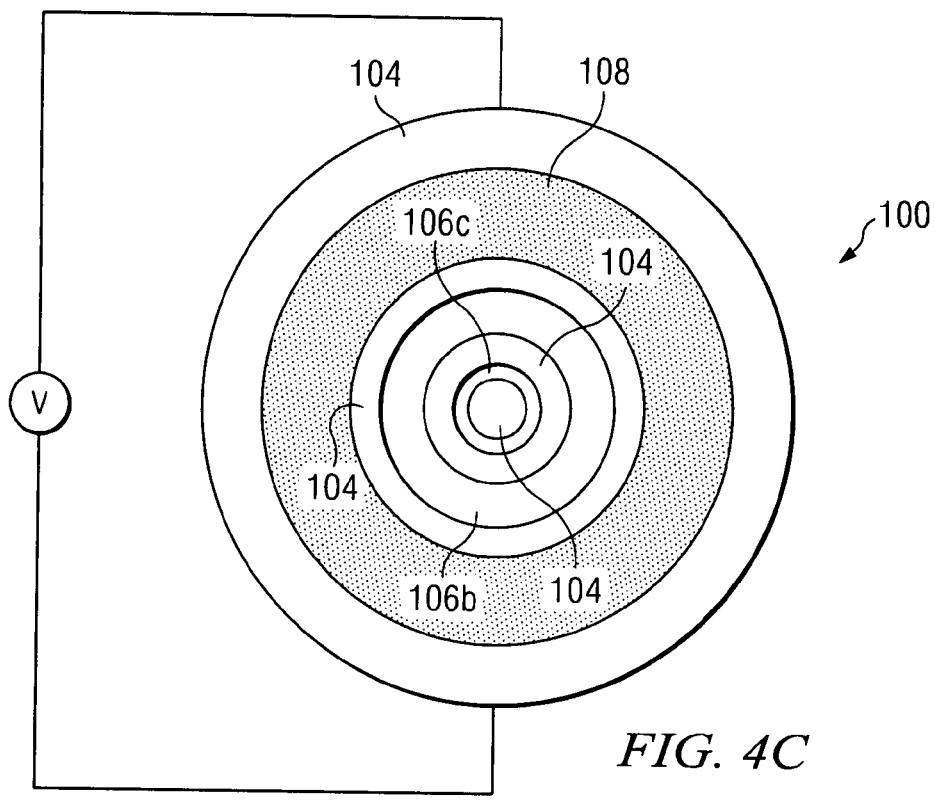
FIG. 4C shows the lens of FIG. 4A after a second voltage is applied to the electro-optical material, resulting in a second portion of the patterned opaque material of the lens being blocked.

FIG. 4A shows a top view or bottom view of the patterned opaque material 104 of the lens 100 of FIG. 1 in accordance with a third embodiment of the present invention, wherein the pattern of the opaque material 104 comprises at least two annular patterns 106a, 106b, and 106c. FIG. 4B shows the lens 100 of FIG. 4A after a first voltage from voltage source V is applied to the electro-optical material 108, resulting in a first portion, annular pattern 106b, of the patterned opaque material 104 of the lens 100 being blocked by the electro-optical material 108 and leaving the patterns 106a and 106c exposed. FIG. 4C shows the lens 100 of FIG. 4A after a second voltage from voltage source V is applied to the electro-optical material 108 in a different location on the electro-optical material 108 than the first voltage was applied, resulting in a second portion, annular pattern 106a, of the patterned opaque material 104 of the lens 100 being blocked by the electro-optical material 108 and leaving the patterns 106b and 106c exposed. Likewise, additional voltages may be applied to the electro-optical material 108 to expose, dim, or block other portions (e.g., annular pattern 106c) of the patterned opaque material 104, not shown.

Note that only three annular patterns 106a, 106b, and 106c are shown in this embodiment; alternatively, additional annular patterns may be included in the opaque material 104 and may be selected or deselected using the novel electro-optical material 108 of the lens 100, not shown. Or, alternatively, other aperture patterns comprising different shapes (not shown) may be included in the patterned opaque material 104 and may be selected or deselected using the electro-optical material 108 of the novel lens 100.

In the embodiments shown in FIGS. 3A through 3C and 4A through 4C, a plurality of patterns 106a, 106b, and 106c are formed in the opaque material 104, and one or more of the plurality of patterns 106a, 106b, and 106c is exposed or unexposed using the electro-optical material 108 as a switching mechanism by applying one or more voltages at one or more locations, e.g., from one edge to another opposing edge, or across a section or pattern, of the electro-optical material 108, during an exposure process. The electrical contacts to the electro-optical material 108 are preferably either located at the edge of the material 108 and not in the optical path, or alternatively, the electrical contacts and wiring may be small enough to not interfere with the optical path of the light or energy being used in the exposure process, as examples.

Figure 5A:
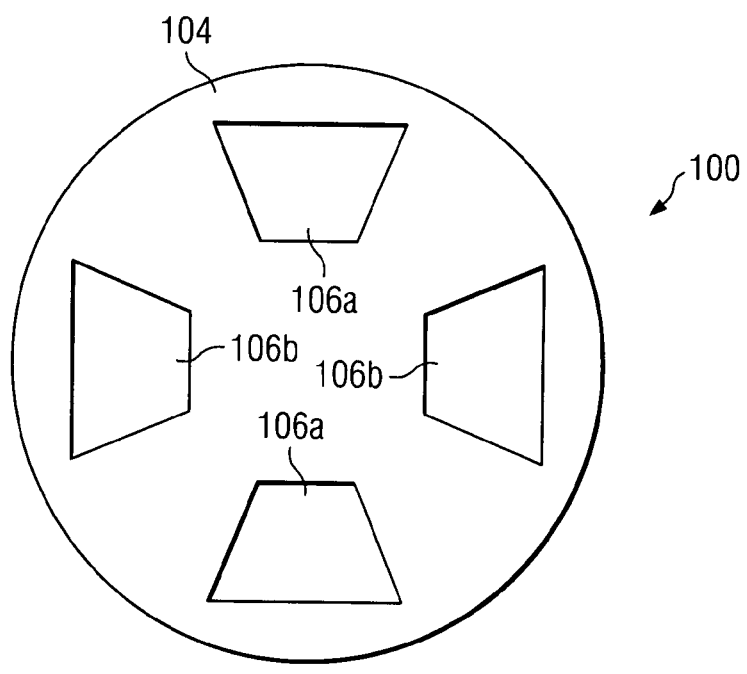
FIG. 5A shows a top view or bottom view of the patterned opaque material of the lens of FIG. 1 in accordance with a fourth embodiment of the present invention, wherein the pattern of the opaque material comprises a quadrapole aperture pattern.
Figure 5B:
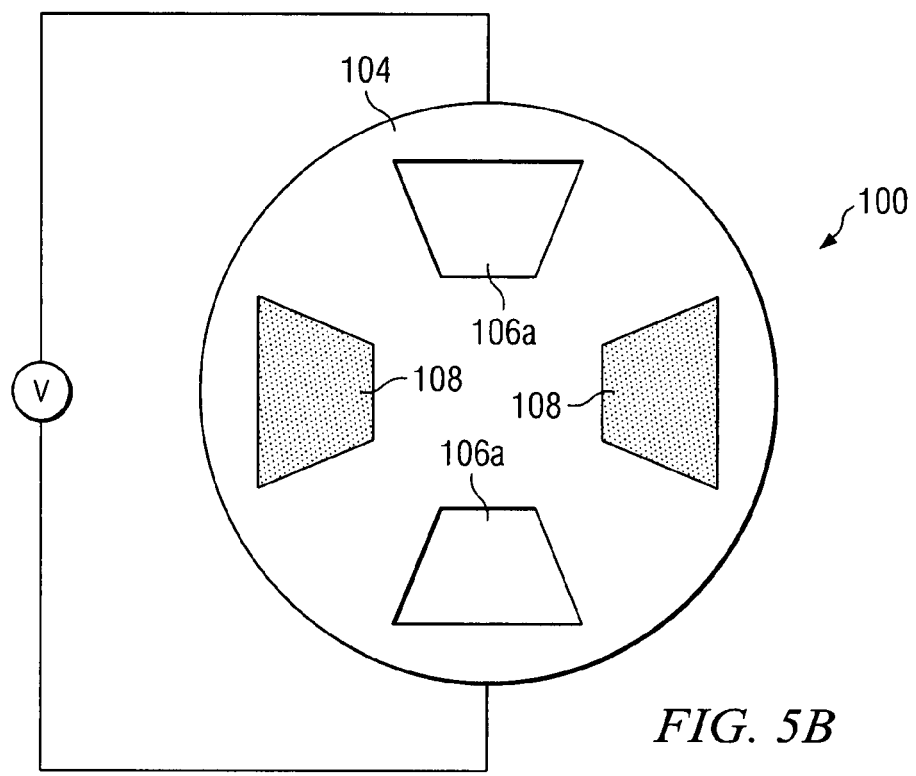
FIG. 5B shows the lens of FIG. 5A after a voltage is applied to the electro-optical material, resulting in a portion of the patterned opaque material of the lens being blocked, forming a dipole aperture pattern.

In other embodiments, a pattern 106 is formed in the opaque material 104, and a portion of the pattern 106 is blocked (or dimmed) to form another pattern, using the electro-optical material 108 as a switching mechanism. FIG. 5A shows a top view or bottom view of the patterned opaque material 104 of the lens 100 of FIG. 1 in accordance with a fourth embodiment of the present invention, wherein the pattern 106 of the opaque material 104 comprises a quadrapole pattern 106a and 106b. FIG. 5B shows the lens of FIG. 5A after a voltage is applied to the electro-optical material 108, resulting in a portion (e.g., pattern 106b) of the patterned opaque material 104 of the lens 100 being blocked, resulting in a dipole pattern 106a.

The portion 106b of the patterned opaque material 104 of the lens 100 may also be partially blocked to dim the portion 106b rather than completely block it. If a certain voltage level is required to cause the electro-optical material 108 to be completely opaque, then a reduced amount of this voltage level may be applied to the electro-optical material 108 in order to cause it to become partially opaque rather than substantially opaque, for example. Patterns of the opaque material 104 in the other embodiments described herein may also be dimmed using a similar technique, by applying a reduced amount of voltage to the electro-optical material, for example.

Note that alternatively, pattern 106a may be blocked or dimmed by the electro-optical material 108, and pattern 106b may be left exposed, to be used for illumination in an exposure process, for example, not shown in the figures.

Embodiments of the present invention may be used to provide a wide variety of illumination apertures within a single illuminator lens 100. Many combinations of illumination aperture configurations may be produced using a single lens 100 described herein, reducing costs by reducing the number of lenses and aperture covers required. Furthermore, the time required to change lenses 100 of illuminators is eliminated or reduced. Rather than requiring the rotation of a canister to position a different mechanical aperture in an illuminator, the voltage levels may be varied at various locations on the electro-optical material 108 of the lens 100 to achieve desired illumination apertures.

Figure 6:
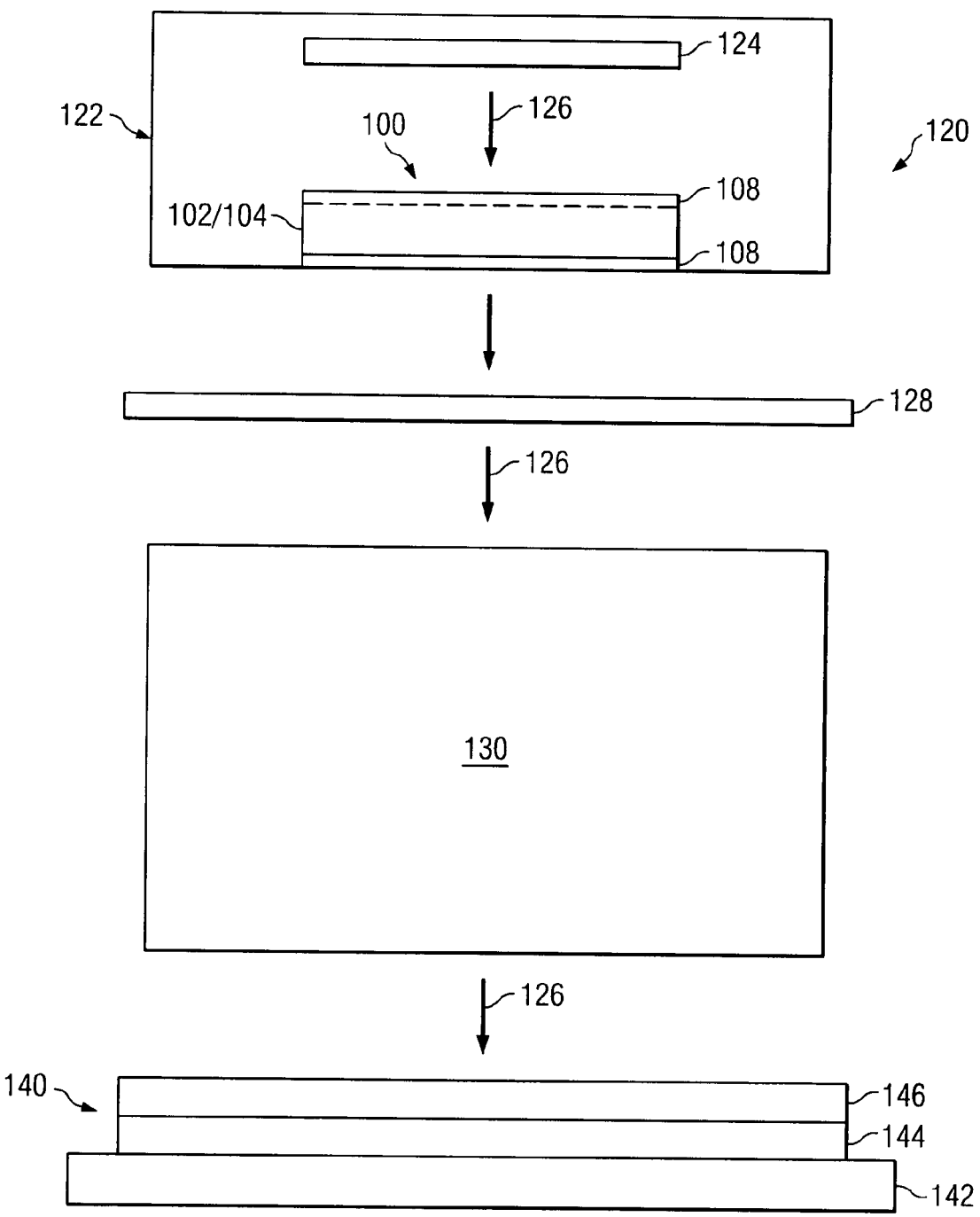
FIG. 6 shows a lithography system including the novel aperture lens of FIG. 1 being used to process a semiconductor device in accordance with an embodiment of the present invention.

FIG. 6 shows a lithography system 120 or microlithography exposure tool including the novel aperture lens 100 of FIG. 1 being used to process a semiconductor device 140 in accordance with an embodiment of the present invention. The lithography system 120 includes an illuminator 122, a lithography mask or reticle 128, a projection lens system 130, and a support or wafer stage 142 for a semiconductor device 140.

The illuminator 122 comprises an energy or light source 124 and the novel aperture lens 100 described herein. The lens 100 may comprise or may be disposed proximate a condenser lens, for example. The energy source 124 may comprise a mercury-vapor lamp, an excimer laser, krypton fluoride (KrF), argon fluoride (ArF), or combinations thereof, as examples, although other light or energy sources may also be used. The illuminator 122 includes a voltage source (not shown in FIG. 6; see voltage source V in FIGS. 3B, 3C, 4B, 4C, and 5B) coupled to at least a portion of the electro-optical material 108 of the lens 100. The illuminator 122 may also include an integrator (not shown) disposed between the light source 124 and the lens 100. The illuminator 122 may be adapted to emit non-polarized light, or alternatively, the illuminator 122 may be adapted to emit polarized light; e.g., the illuminator 122 may include a polarizer (not shown) adapted to produce light polarized in the x direction (wherein the x direction is the same as the scanning direction), the y direction, or both.

Note that in FIG. 6, the electro-optical material 108 is shown disposed on the side of the transparent material 102 that is positioned facing away from the energy source 124. The electro-optical material 108 may also be disposed on the side of the transparent material 102 that is positioned facing towards the energy source 124, as shown in phantom.

The projection lens system 130 is disposed proximate the illuminator 122. The projection lens system 130 comprises a plurality of lenses (not shown) and is adapted to project an image from the lithography mask 128 onto a layer of photosensitive material 146, such as a layer of photoresist of a semiconductor device 140. The semiconductor device 140 may include a workpiece, wafer, or substrate 144 having a material layer (not shown in FIG. 6; see FIGS. 7 and 8 at 148) disposed thereon that will be patterned using the layer of photosensitive material 146 as a mask, for example.

Energy or light 126 is directed towards the semiconductor device 140 (e.g., towards the support 142 for the semiconductor device 140) from the illuminator 122 through the mask 128 and the projection lens system 130, as shown, along an optical path. Portions of the electro-optical material 108 are switched on or off, e.g., making segments or patterns of the electro-optical material 108 substantially opaque or substantially transparent, and exposing patterns in the opaque material 104 or forming aperture patterns within the electro-optical material 108 itself. The energy or light 126 is re-converged by the projection lens system 130 onto the layer of photosensitive material 146 such that a latent image of the mask 128 is reproduced onto the layer of photosensitive material 146 of the semiconductor device 140. The layer of photosensitive material 146 is developed, and unexposed (or exposed, depending on whether the resist is negative or positive, respectively) resist is removed, leaving behind a patterned layer of photosensitive material 146. The patterned layer of photosensitive material 146 is then used as a mask while a portion of the workpiece 144 is altered.

Figure 9:
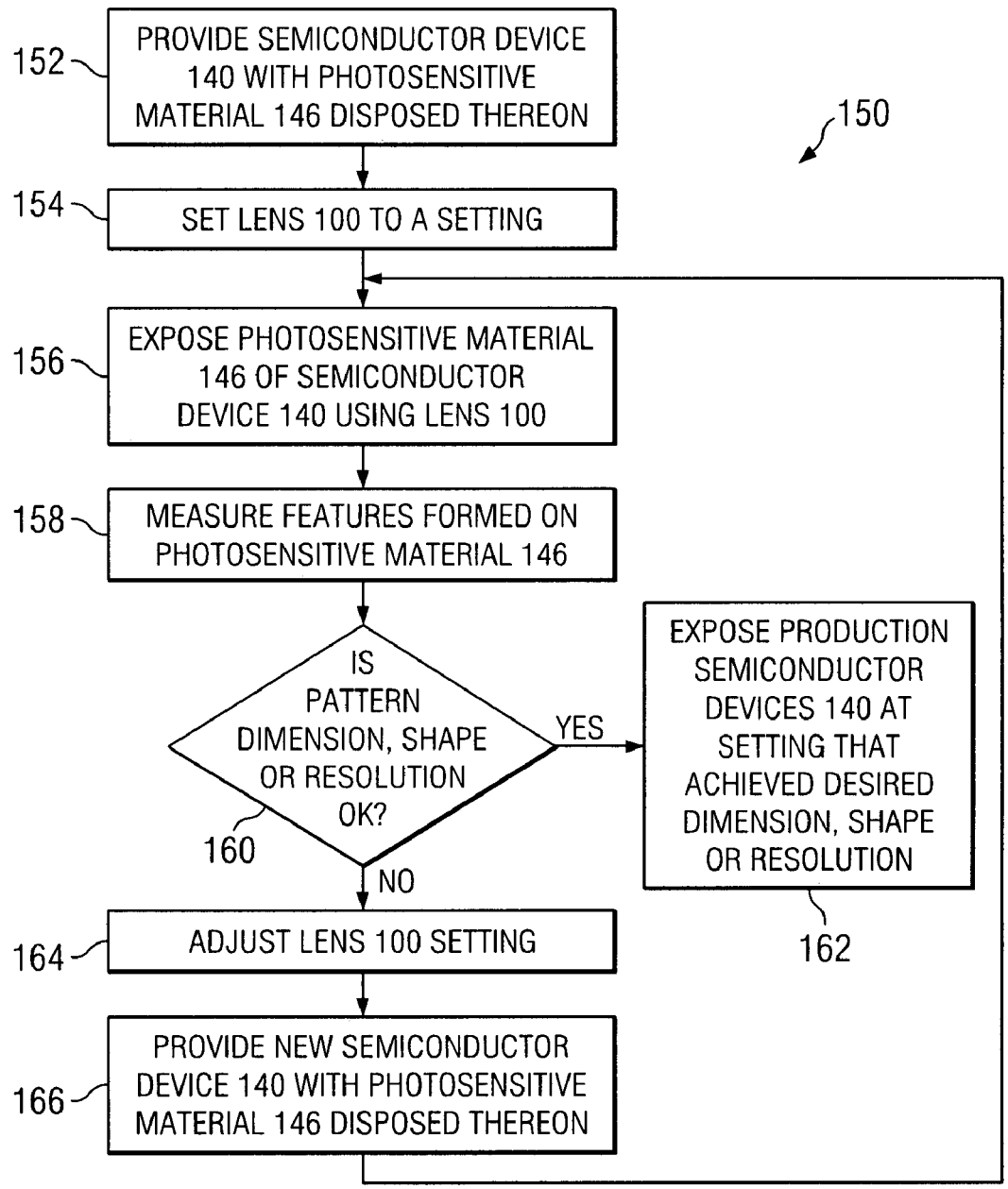
FIG. 9 is a flow chart illustrating a method of implementing the novel aperture lens of embodiments of the present invention, wherein a feedback loop is used to obtain an optimum illumination setting of the lens for a manufacturing or production process flow for a particular semiconductor device product.

Note that the lithography system 120 also preferably includes hardware and/or software adapted to provide a feedback loop regarding the exposure process and settings using the aperture lens 100, to be described further herein with reference to the flow chart shown in FIG. 9.

Figure 7:
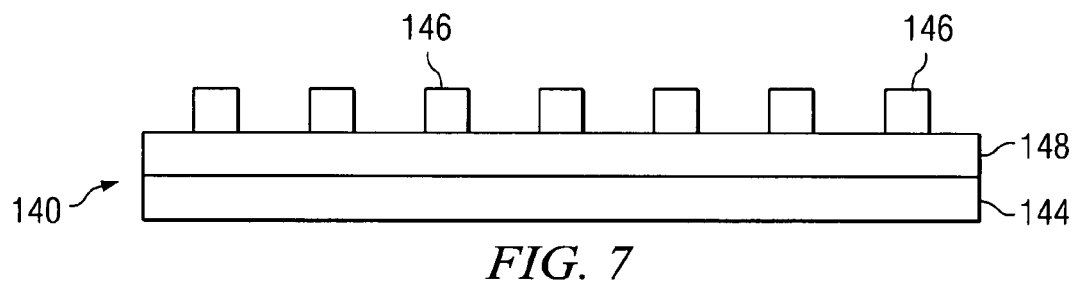
FIG. 7 shows a semiconductor device having a layer of photosensitive material formed thereon that has been patterned using a lithography system implementing the novel lens of embodiments of the present invention.
Figure 8:
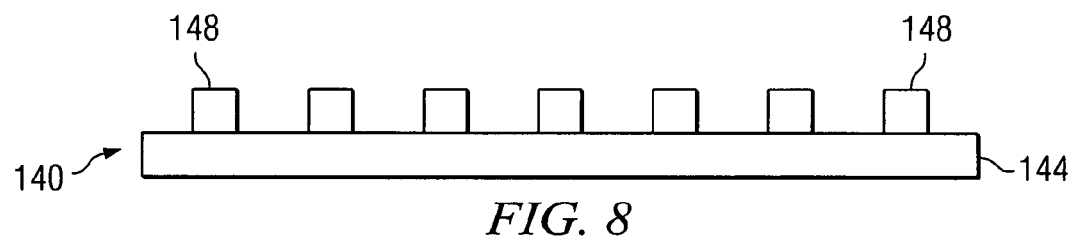
FIG. 8 shows the semiconductor device of FIG. 7 after the layer of photosensitive material has been used to pattern a material layer of the semiconductor device.

FIG. 7 shows a semiconductor device 140 having a layer of photoresist 146 disposed thereon that has been patterned using the lithography system 120 having the illuminator 122 with the novel lens 100 in accordance with embodiments of the present invention shown in FIG. 6. After the exposure process, the pattern in the layer of photoresist 146 comprises a latent pattern, which is then developed to form a pattern in the layer of photoresist 146, as shown in FIG. 7. FIG. 8 shows the semiconductor device 140 of FIG. 7 after the layer of photoresist 146 has been used to pattern a material layer 148 of the semiconductor device 140, and after the layer of photoresist 146 has been removed.

Embodiments of the present invention include methods of processing semiconductor devices 140 using the novel illuminator lenses 100 described herein. For example, referring again to FIGS. 6 and 7, in accordance with an embodiment of the present invention, a method of processing a semiconductor device 140 includes providing a workpiece 144, the workpiece 144 including a layer of photosensitive material 146 disposed thereon. The method includes providing the lithography system 120, the lithography system 120 including an illuminator 122 comprising a lens 100. The lens 100 comprises a substantially transparent material 102 and an electro-optical material 108 disposed proximate the substantially transparent material 102. A lithography mask 128 is disposed between the illuminator 122 of the lithography system 120 and the workpiece 144. The method includes patterning the layer of photosensitive material 146 using the lithography mask 128 and the lithography system 120.

In some embodiments, providing the lithography system 120 comprises providing a lithography system 120 wherein the lens 100 of the illuminator 122 further comprises a substantially opaque material 104 adjacent to at least the substantially transparent material 102, the substantially opaque material 104 comprising at least one pattern 106 disposed thereon. The method may include at least partially blocking at least portions of the at least one pattern 106 of the substantially opaque material 104 by applying an electric field to a portion of the electro-optical material 108 of the lens 100, while patterning the layer of photosensitive material 146 of the workpiece 144.

In some embodiments, the method of processing the semiconductor device 140 may include fabricating a semiconductor device 140. The workpiece 144 may include a material layer 148 to be altered formed thereon, and a layer of photosensitive material 146 is disposed over the material layer 148. Alternatively, the workpiece 144 may be altered using the layer of photosensitive material 146 as a mask, for example (e.g., a top portion of the workpiece 144 comprises the material layer 148 in this embodiment). The method may further include using the layer of photosensitive material 146 as a mask to alter the material layer 148 of the workpiece 144, and then the layer of photosensitive material 146 is removed.

Altering the material layer 148 of the workpiece 144 may include removing at least a portion of the material layer 148, as shown in FIG. 8. Alternatively, altering the material layer 148 of the workpiece 144 may comprise implanting the material layer 148 with a substance (such as a dopant or element), growing a substance on the material layer 148, or depositing a substance on the material layer 148, as examples, not shown in the drawings, although alternatively, the material layer 148 may also be altered in other ways. The material layer 148 of the workpiece may comprise a conductive material, an insulating material, a semiconductive material, or multiple layers or combinations thereof, as examples.

Embodiments of the present invention also include semiconductor devices 140 patterned using the novel aperture lenses 100, methods, and lithography systems 120 described herein, for example.

Embodiments of the present invention also include methods of manufacturing the novel aperture lenses 100 described herein. In one embodiment, a method of manufacturing the lens 100 preferably comprises providing a substantially transparent material 102, and forming an electro-optical material 108 proximate the substantially transparent material 102. In some embodiments, a layer of opaque material 104 may be formed over the substantially transparent material 104, and at least one pattern 106 is formed within the layer of opaque material 104. Forming the at least one pattern 106 within the layer of opaque material 104 may comprise forming at least one pattern 106 comprising a dipole aperture, a quadrupole aperture, an annular aperture, a single beam aperture, a multiple beam aperture, a plurality of sizes thereof, and/or combinations thereof, as examples, although other types and forms of patterns and apertures may be used. The electro-optical material 108 may be formed directly over and adjacent to the substantially transparent material 102, or directly over and adjacent to the layer of opaque material 104, for example.

FIG. 9 is a flow chart 150 illustrating a method of implementing the novel aperture design comprising the lens 100 of embodiments of the present invention, wherein a feedback loop is used to obtain an optimum illumination setting for the lens 100 for a manufacturing or production process flow for a particular semiconductor device 140 product. Referring to step 152, first, a semiconductor device 140 is provided that has a photosensitive material 146 disposed thereon. The novel lens 100 of embodiments of the present invention (which is implemented in a lithography system 120 such as the one shown in FIG. 6, for example) is set to a setting (step 154). The setting is preferably an initial setting which has been estimated to be an effective illumination setting or aperture type, size, or shape for the particular features to be formed in the semiconductor device 140, for example, although the initial setting may also comprise an arbitrary first setting.

The photosensitive material 146 of the semiconductor device 140 is exposed using the lens 100 and the lithography system 120 (step 156). The photosensitive material 146 is developed, and features (e.g., a width of one or more lines) formed on the photosensitive material 146 are measured (step 158). The measured features are compared to a desired size (e.g., dimension), shape, and/or resolution of the features (step 160). If the pattern of the measured features are the desired size, shape, and/or resolution, then production semiconductor device 140 are exposed at the setting that achieved the desired size of features, e.g., at the initial setting (step 162) of the lens 100.

However, if the patterns of the features are not measured to be the desired size, shape, and/or resolution after the exposure at the initial setting, then the lens 100 setting is adjusted (step 164). A new semiconductor device 140 is provided with a photosensitive material 146 disposed thereon (step 166). Then, steps 156, 158, and 160 are repeated until the patterns of features formed on a semiconductor device 140 are the desired size, shape, and/or resolution. Once the optimum setting for the lens 100 is determined, then production semiconductor devices 140 are processed (step 162) at the optimum lens 100 setting.

In other words, in some embodiments of the present invention, a method of processing a semiconductor device 140 comprises providing a workpiece 144 comprising a first test workpiece having the layer of photosensitive material 146 formed thereon. Patterning the layer of photosensitive material 146 comprises applying a first voltage to the electro-optical material 108 of the lens 100. After patterning the layer of photosensitive material 146, a pattern formed on the first test workpiece is measured, and the measured pattern of the first test workpiece is compared to a predetermined desired dimension, shape, and/or resolution. A predetermined desired dimension maybe a critical dimension (CD) or minimum feature size of the semiconductor device 140, in some embodiments, for example. In other embodiments, a shape or resolution of the pattern of the first test workpiece is measured and compared to a desired shape or resolution, as examples. At least one second workpiece is patterned using the lithography mask 128 and the lithography system 120 with at least one second voltage applied to the electro-optical material 108 of the lens 100, the at least one second voltage being different than the first voltage. The second voltage may be placed in a different position on the electro-optical material 108 or may comprise a different voltage level than the first voltage, for example. The method includes repeating patterning at least one second workpiece using the at least one second voltage until a measured pattern on the at least one second workpiece comprises the predetermined desired dimension, shape, and/or resolution.

The novel feedback loop illustrated in the flow chart 150 of FIG. 9 may be used to measure CD uniformity data, by using a "send-ahead" wafer or semiconductor device 140 that is exposed and measured. The measured data may then be fed back to software of the lithography system 120, which may be used to create and control the electrical settings (e.g., the voltage levels) to model the illumination aperture of the lens 100 for subsequent exposure processes, for example.

Again, note that the novel aperture lens 100 of embodiments of the present invention may be used with illuminators 122 and lithography systems 120 that utilize polarized or non-polarized light. For example, the illuminator 122 may include a polarizer or grating that provides polarization in the x or y direction, or both (not shown). The light or energy 126 may also be polarized by the movement of the scanner or by the shape of the aperture, e.g., the patterns 106 in the opaque material 104, for example.

Embodiments of the present invention are advantageous when used in lithography systems 120 such as deep ultraviolet (DUV) lithography systems, immersion lithography systems, or other lithography systems that use visible light for illumination, as examples. Embodiments of the present invention may be implemented in lithography systems, steppers, scanners, step-and-scan exposure tools, or other exposure tools, as examples. The embodiments described herein are implementable in lithography systems 120 that use refractive optics, for example. Embodiments of the present invention may also have useful application in lithography systems that utilize extreme ultraviolet (EUV) light and reflective optics.

Features of semiconductor devices 140 patterned using the novel lenses 100, illuminators 122, and lithography systems 120, and processing methods described herein may comprise transistor gates, conductive lines, vias, capacitor plates, and other features, as examples. Embodiments of the present invention may be used to pattern features of memory devices, logic circuitry, and/or power circuitry, as examples, although other types of ICs may also be fabricated using the novel lenses 100, illuminators 122, and lithography systems 120, and processing methods described herein.

The novel lenses 100 are beneficial and have useful application in technical fields other than lithography of semiconductor devices, e.g., in other applications wherein a beam of energy transmitted in different patterns is required, for example.

Advantages of embodiments of the present invention include providing novel lenses 100 for illuminators 122 of lithography systems 120, lithography systems 120, methods of fabrication thereof, and methods for patterning and processing semiconductor devices 140. Variable illumination apertures are achieved by applying an electro-optical effect to the lenses 100. The lenses 100 include the use of electro-optical active materials 108 that provide a high degree of freedom in realizing a large variety and number of shapes of illumination apertures. Illumination apertures may be defined and selected depending on the desired exposure results. A different illumination aperture may be used for various material layers and processing steps in the manufacture of a particular semiconductor device 140, by altering the voltages applied to the electro-optical material 108 of the novel lenses 100, for example. A flexible illumination system is achieved with variable aperture shapes by the use of the aperture lenses 100.

The lenses 100 may be used with polarized or non-polarized light. The lenses 100 are particularly advantageous in some applications when used with polarized light, which may require special shaped illumination apertures to produce desired polarization settings, for example. The illumination quality may be optimized using the polarization effects in some applications. Because the lenses 100 provide a highly flexible illumination system, arbitrary shaped illumination apertures may quickly and easily be achieved without having to change a mechanical aperture or replace the lens 100 of the illuminator of the lithography system, for example. A feedback loop may be used to optimize the aperture shape selection of the aperture lens 100.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An optical component, comprising:
    a substantially transparent material;
    an electro-optical material disposed proximate the substantially transparent material, the electro-optical material comprising a solid crystal; and
    a substantially opaque material adjacent to at least the substantially transparent material, wherein at least a portion of the substantially opaque material is spaced from an edge of the optical component by a portion of the substantially transparent material.

2. The optical component according to claim 1, wherein an index of refraction and/or an amount of absorption of at least a portion of the electro-optical material is alterable by applying an electric field to the electro-optical material.

3. The optical component according to claim 2, wherein the index of refraction and/or the amount of absorption of the electro-optical material, is alterable over a plurality of segments of the electro-optical material, and wherein the index of refraction and/or the amount of absorption of one or more of the plurality of segments may be simultaneously altered by the electric field to form an arbitrary shaped illumination shutter.

4. The optical component according to claim 1, wherein the solid crystal comprises LBO ($LiB_3O_5$), BBO (beta-$BaB_2O_4$), CLBO ($CsLiB_6O_{10}$), and/or KDP ($KH_2PO_4$).

5. The optical component according to claim 1, wherein the electro-optical material comprises a thickness of about 6 mm or less.

6. The optical component according to claim 1, wherein the substantially opaque material comprises at least one pattern disposed thereon.

7. The optical component according to claim 6, wherein an index of refraction and/or an amount of absorption of at least a portion of the electro-optical material is alterable by applying an electric field to the at least the portion of the electro-optical material, and wherein altering the index of refraction and/or the amount of absorption of at least a portion of the electro-optical material blocks, exposes, or dims at least a portion of the at least one pattern disposed on the substantially opaque material.

8. An illuminator, comprising:
    an energy source, wherein the energy source emits polarized light; and
    an optical component proximate the energy source, the optical component including a substantially transparent material and an electro-optical material disposed proximate the substantially transparent material, wherein at least a portion of the electro-optical material is optically substantially transparent with a first voltage applied thereto, and wherein the at least a portion of the electro-optical material is optically substantially or partially opaque with a second voltage applied thereto, the second voltage being different than the first voltage.

9. The illuminator according to claim 8, wherein the energy source comprises a mercury-vapor lamp, an excimer laser, krypton fluoride (KrF), argon fluoride (ArF), or combinations thereof.

10. The illuminator according to claim 8, wherein the energy source emits nonpolarized light.

11. A lithography system including the illuminator of claim 8, further comprising:
    a support for a semiconductor workpiece;
    a projection lens system disposed between the support for the semiconductor workpiece and the illuminator; and
    a lithography mask disposed between the illuminator and the projection lens system, wherein the illuminator is adapted to direct the energy or light towards the support for the semiconductor workpiece through the projection lens system and lithography mask along an optical path.

12. A method of processing a semiconductor device, the method including:
    providing a workpiece, the workpiece including a layer of photosensitive material disposed thereon;
    providing a lithography system, the lithography system including an illuminator comprising an optical component, the optical component comprising a substantially transparent material and an electro-optical material disposed proximate the substantially transparent material;
    disposing a lithography mask between the illuminator of the lithography system and the workpiece; and
    patterning the layer of photosensitive material using the lithography mask and the lithography system.

13. The method according to claim 12, wherein providing the lithography system comprises providing a lithography system wherein the optical component of the illuminator further comprises a substantially opaque material adjacent to at least the substantially transparent material, the substantially opaque material comprising at least one pattern disposed thereon.

14. The method according to claim 13, further comprising at least partially blocking at least portions of the at least one pattern of the substantially opaque material by applying an electric field to a portion of the electro-optical material of the optical component, while patterning the layer of photosensitive material of the workpiece.

15. The method according to claim 12, wherein the method of processing the semiconductor device comprises providing a workpiece comprising a first test workpiece, wherein patterning the layer of photosensitive material comprises applying a first voltage to the electro-optical material of the optical component, further comprising:
    after patterning the layer of photosensitive material, measuring a pattern formed on the first test workpiece;
    comparing the measured pattern of the first test workpiece to a predetermined desired dimension, shape, and/or resolution;
    patterning at least one second workpiece using the lithography mask and the lithography system with at least one second voltage applied to the electro-optical material of the optical component, the at least one second voltage being different than the first voltage; and
    repeating patterning at least one second workpiece using the at least one second voltage until a measured pattern on the at least one second workpiece comprises the predetermined desired dimension, shape, and/or resolution.

16. The method according to claim 12, wherein the method of processing the semiconductor device comprises fabricating a semiconductor device, wherein providing the workpiece comprises providing a workpiece having a material layer to be altered formed thereon, the layer of photosensitive material being disposed over the material layer, further comprising using the layer of photosensitive material as a mask to alter the material layer of the workpiece, and removing the layer of photosensitive material.

17. The method according to claim 16, wherein altering the material layer of the workpiece comprises removing at least a portion of the material layer, implanting the material layer with a substance, growing a substance on the material layer, or depositing a substance on the material layer.

18. The method according to claim 16, wherein the material layer of the workpiece comprises a conductive material, an insulating material, a semiconductive material, or multiple layers or combinations thereof.

19. A semiconductor device manufactured in accordance with the method of claim 18.

20. A method of manufacturing an optical component for an illuminator of a lithography system, the method comprising:
providing a substantially transparent material having a long side and a short side;
forming an electro-optical material proximate the long side of the substantially transparent material, the electro-optical material comprising a solid crystal;
depositing a layer of opaque material over the long side of the substantially transparent material; and
forming at least one pattern within the layer of opaque material.

21. The method according to claim 20, wherein forming the at least one pattern within the layer of opaque material comprises forming at least one pattern comprising a dipole aperture, a quadrapole aperture, an annular aperture, a single beam aperture, a multiple beam aperture, a plurality of sizes thereof, and/or combinations thereof.

22. The method according to claim 20, wherein forming the electro-optical material comprises forming the electro-optical material over the substantially transparent material or over the layer of opaque material.

23. The method according to claim 20, wherein forming the electro-optical material comprises forming a birefringent material, and wherein an electrical field applied to the electro-optical material is adapted to fully block, partially block, or expose a portion of the at least one pattern within the layer of opaque material.

24. A lithography system, comprising:
an illuminator comprising an energy source and an optical component proximate the energy source, the optical component including a substantially transparent material and an electro-optical material disposed proximate the substantially transparent material;
a support for a semiconductor workpiece;
a projection lens system disposed between the support for the semiconductor workpiece and the illuminator; and
a lithography mask disposed between the illuminator and the projection lens system, wherein the illuminator is adapted to direct the energy or light towards the support for the semiconductor workpiece through the projection lens system and lithography mask along an optical path.

25. The lithography system according to claim 24, further comprising a voltage source coupled to the electro-optical material.

26. The lithography system of claim 24, wherein: the energy source comprises a mercury-vapor lamp, an excimer laser, krypton fluoride (KrF), argon fluoride (ArF), or combinations thereof.

27. The lithography system of claim 24, wherein: the energy source emits polarized light.

* * * * *